(12) United States Patent
Britting et al.

(10) Patent No.: US 11,338,397 B2
(45) Date of Patent: May 24, 2022

(54) SOLDERING MATERIAL FOR ACTIVE SOLDERING AND METHOD FOR ACTIVE SOLDERING

(71) Applicant: Rogers Germany GmbH, Eschenbach (DE)

(72) Inventors: Stefan Britting, Schnaittach (DE); Andreas Meyer, Nenzenbacg (DE)

(73) Assignee: ROGERS GERMANY GMBH, Eschenbach (DE)

( * ) Notice: Subject to any disclaimer, the term of this patent is extended or adjusted under 35 U.S.C. 154(b) by 142 days.

(21) Appl. No.: 16/628,554

(22) PCT Filed: Jul. 4, 2018

(86) PCT No.: PCT/EP2018/068020
§ 371 (c)(1),
(2) Date: Jan. 3, 2020

(87) PCT Pub. No.: WO2019/008003
PCT Pub. Date: Jan. 10, 2019

(65) Prior Publication Data
US 2020/0384579 A1    Dec. 10, 2020

(30) Foreign Application Priority Data
Jul. 4, 2017  (DE) .......................... 102017114893.0

(51) Int. Cl.
*B23K 1/00*      (2006.01)
*B23K 35/30*    (2006.01)
(Continued)

(52) U.S. Cl.
CPC .......... *B23K 35/302* (2013.01); *B23K 1/0016* (2013.01); *B23K 35/025* (2013.01);
(Continued)

(58) Field of Classification Search
CPC ................ B23K 35/302; B23K 1/0016; B23K 35/0233; B23K 35/025; B23K 2101/36;
(Continued)

(56) References Cited

U.S. PATENT DOCUMENTS

| 4,426,033 A | 1/1984 | Mizuhara |
| 4,603,090 A | 7/1986 | Mizuhara |

(Continued)

FOREIGN PATENT DOCUMENTS

| CN | 1076648 A | 9/1993 |
| CN | 102554385 A | 7/2012 |

(Continued)

OTHER PUBLICATIONS

International Search Report for International Application No. PCT/EP2018/068020, International Filing Date Jul. 2, 34018, dated Sep. 26, 2018, 4 pages.

(Continued)

*Primary Examiner* — Kiley S Stoner
(74) *Attorney, Agent, or Firm* — Cantor Colburn LLP

(57) ABSTRACT

A soldering material (1) for active soldering, in particular for active soldering of a metallization (3) to a carrier layer (2) comprising ceramics, wherein the soldering material comprises copper and is substantially silver-free.

5 Claims, 1 Drawing Sheet

(51) Int. Cl.
*B23K 35/02* (2006.01)
*C22C 9/02* (2006.01)
*C22C 9/05* (2006.01)
*H05K 3/34* (2006.01)
*B23K 101/36* (2006.01)
*B23K 103/00* (2006.01)

(52) U.S. Cl.
CPC ............ B23K 35/0233 (2013.01); C22C 9/02 (2013.01); C22C 9/05 (2013.01); H05K 3/3457 (2013.01); *B23K 2101/36* (2018.08); *B23K 2103/52* (2018.08)

(58) Field of Classification Search
CPC ............ B23K 2103/52; B23K 2103/08; B23K 2103/18; B23K 35/005; B23K 35/0222; B23K 35/001; B23K 1/19; C22C 9/02; C22C 9/05; H05K 3/3457; C04B 2237/127; C04B 2237/126; C04B 2237/12; C04B 2237/124; C04B 2237/34; C04B 2237/343; C04B 2237/366; C04B 2237/368; C04B 2237/407; C04B 37/026
USPC .................................................. 420/469–500
See application file for complete search history.

(56) References Cited

U.S. PATENT DOCUMENTS

| | | | |
|---|---|---|---|
| 4,661,416 A | | 4/1987 | Mizuhara |
| 5,013,612 A | * | 5/1991 | Hunt .................. B23K 35/32 428/469 |
| 5,832,360 A | * | 11/1998 | Andrews .............. B23K 35/302 428/552 |
| 6,187,071 B1 | * | 2/2001 | Andrews ............ B23K 35/0244 228/122.1 |
| 6,367,683 B1 | * | 4/2002 | Rass ..................... B23K 35/26 228/111.5 |
| 2015/0257252 A1 | * | 9/2015 | Kato ........................ H01L 24/83 257/773 |
| 2016/0001388 A1 | * | 1/2016 | Oohiraki .............. B23K 1/0016 228/122.1 |
| 2016/0181123 A1 | * | 6/2016 | Terasaki ............ H01L 21/4846 228/122.1 |
| 2016/0358791 A1 | * | 12/2016 | Terasaki ................ C04B 37/025 |
| 2017/0062305 A1 | * | 3/2017 | Terasaki ................. H01L 25/07 |

FOREIGN PATENT DOCUMENTS

| | | | | |
|---|---|---|---|---|
| CN | 104755445 A | | 7/2015 | |
| DE | 2457198 A1 | * | 6/1976 | ............. C22C 9/02 |
| EP | 0185954 A2 | | 7/1986 | |
| EP | 0492435 A1 | | 7/1992 | |
| FR | 2298609 A1 | * | 8/1976 | ............. B24D 3/08 |
| JP | H04238877 A | | 8/1992 | |
| JP | 0532463 A | | 2/1993 | |
| JP | 2003283064 A | | 10/2003 | |
| JP | 2003305588 A | | 10/2021 | |
| KR | 20100064389 A | | 6/2010 | |

OTHER PUBLICATIONS

Written Opinion for International Application No. PCT/EP2018/068020, International Filing Date Jul. 4, 2018, dated Sep. 26, 2018, 8 pages.

* cited by examiner

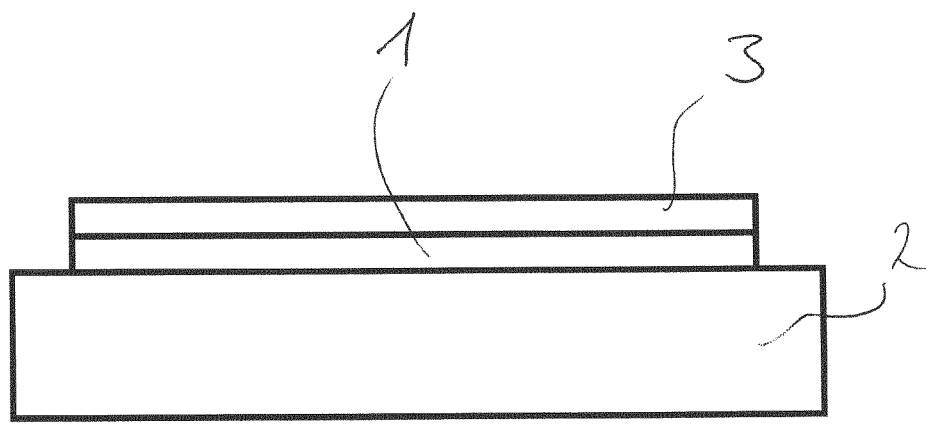

SOLDERING MATERIAL FOR ACTIVE SOLDERING AND METHOD FOR ACTIVE SOLDERING

CROSS-REFERENCE TO RELATED APPLICATIONS

This application is a National Stage application of PCT/EP2018/068020, filed Jul. 4, 2018, which claims the benefit of German Application No. 10 2017 144 893.0, filed Jul. 4, 2017, both of which are incorporated by reference in their entirety herein.

BACKGROUND

The present invention concerns a soldering material for active soldering and a method for active soldering of electronic components and parts.

Soldering materials are well known from the state of the art, e.g. from US 2014 126 155 A1, and are used for a material-locking connection of components. In particular, the present invention concerns soldering materials intended for active soldering and used to bond a metallization to a carrier substrate, comprising ceramics. Typically, such soldering materials contain a comparatively high proportion of silver, if the soldering is to be carried out at temperatures below 1000° C. This high silver content is accompanied by comparatively high material costs. Furthermore, there is also a risk of silver migration at the edges of the solder layer on the carrier substrate, comprising ceramic, when electrical fields are applied during operation.

From U.S. Pat. No. 4,603,0990 A a ductile soldering foil is known. The soldering foil can consist of 0.1-5 wt. % of a reactive metal from the group Ti, V, Zr or of a mixture of elements from this group as well as 1-30 wt. % of indium and 55-99.8 wt. % of copper.

From DE 10 2015 108 668 A1, a method for producing a printed circuit board is known, wherein the printed circuit board has a flat base material, in particular a ceramic, to which a metallization is applied on one or both sides by means of a solder layer.

The U.S. Pat. No. 4,426,033 A concerns a reactive metal-copper alloy with a certain amount of a third metal from the group of silicon, tin, germanium, manganese, nickel, cobalt or mixtures thereof, this alloy being suitable for soldering ceramics.

U.S. Pat. No. 4,784,313 A specifies a method for joining shaped parts made from SiC ceramic to one another or to shaped parts made of other ceramics or metals, in which the surfaces to be joined are joined under diffusion welding conditions with a metal layer interposed. It is provided here that a manganese alloy layer of MnCu (with 25-82 wt. % Cu) or MnCo (with 5-50 wt. % Co) is used as the metal layer, which optionally additionally has 2-45 wt. % each of at least one of the metals Cr, Ti, Zr, Fe, Ni and/or Ta, the sum of the additives not exceeding 70 wt. %.

DE 698 22 533 T1 further knows a ceramic member having an electrical power supply terminal, wherein a metallic member is embedded in the ceramic member and partially exposed from a recess of the ceramic member, a tubular atmosphere shielding member is inserted into the recess and connected to the embedded metallic member.

SUMMARY OF THE INVENTION

It is therefore an objective of the present invention to provide a soldering material that can be produced cost-effectively compared to the state of the art and in which silver migration can be avoided.

This problem is solved by a soldering material for active soldering wherein the soldering material comprises copper and is substantially silver-free, by a carrier layer including the soldering material and by a method of bonding a metallization to a carrier layer using the soldering material.

Further advantages and specifications of the invention result from the dependent claims as well as the description and attached figures.

BRIEF DESCRIPTION OF THE FIGURE

FIG. 1: a carrier layer having a metallization according to an exemplary embodiment of the present invention.

DETAILED DESCRIPTION OF THE INVENTION

Further advantages and characteristics result from the following description of preferred embodiments of the subject matter of the present invention with reference to the attached FIGURE. Individual characteristics of the individual design can be combined with each other in context of the invention.

According to the invention, a soldering material is provided for active soldering, in particular for active soldering of a metallization to a carrier layer comprising ceramic, wherein the soldering material comprises copper and is substantially silver-free.

Contrary to the state of the art, silver is advantageously omitted from the brazing material according to the invention, whereby manufacturing costs can be reduced and silver migration can be avoided. Instead of silver, copper or a copper alloy is the main component of the soldering material. "Essentially silver-free" means in particular that the soldering material has a silver content in the range of impurities, i.e. less than 0.5 wt. %, preferably less than 0.1 wt. % and particularly preferably less than 0.05 wt. % of the soldering material. Basically, several ceramic layers can be joined together by means of the soldering material, for example, or a metallization, preferably a copper layer, can be bonded to a carrier layer comprising ceramics. Preferably, it is intended that the metallization bonded to the carrier layer is structured, in particular structured, in order to form, for example, conductor tracks or connection points for electrical or electronic components.

Preferably, it is provided that the soldering material is freed of silver or silver residues in one manufacturing step or its proportion is reduced. This is an advantageous way of ensuring that the soldering material is silver-free.

An active soldering method, e.g. for joining metal layers or metal foils, in particular also copper layers or copper foils with ceramic material, is understood to be a method in which a connection between a metal foil, e.g. a copper foil, and a ceramic substrate, e.g. an aluminium nitride ceramic, is produced at a temperature between approx. 650-1000° C. using the soldering material. In addition to a main component, copper, the soldering material also contains an active metal. This active metal, which is for example at least one element of the group Hf, Ti, Zr, Nb, Ce, Cr, V, Y, Sc, forms by chemical reaction with the ceramic a bond between the soldering material and the ceramic by means of a reaction layer, while the bond between the soldering material and the metal is a metallic brazing bond.

In particular, it is provided that the carrier layer has $Al_2O_3$, $Si_3N_4$, AlN, BeO or a ZTA (Zirconia toughened Alumina)

ceramic, hereinafter referred to as HPSX ceramic (i.e. a ceramic with an $Al_2O_3$ matrix, which comprises an x-percent proportion of $ZrO_2$, for example $Al_2O_3$ with 9% $ZrO_2$=HPS9 or $Al_2O_3$ with 25% $ZrO_2$=HPS25), whereby combinations of the said carrier materials are also conceivable.

According to a further embodiment of the present invention, the soldering material is intended to have a copper proportion of between 50 and 90 wt. %, preferably between 55 and 85 wt. % and particularly preferably between 50 and 75 wt. %. In this case, the copper proportion has the advantage of replacing the usually comparatively high silver content. The copper proportion can be adjusted depending on the other individual components.

Preferably it is provided that the copper has a proportion of between 63 and 75 wt. %, preferably between 64 and 70 wt. % and particularly preferably between 65 and 70 wt. % of the soldering material. It has been shown to be advantageous that with such a composition a comparatively large number of different companion or active metals can be used to produce a process-safe soldering material (i.e. a soldering material with which a safe and durable soldering can be achieved) without silver. This allows an individual adaptation of the soldering material to the respective application in an advantageous way, without having to resort to a silver-containing composition for the soldering material.

In a further version of the present invention, it is provided that the soldering material for lowering the melting temperature should have a companion material, preferably gallium (Ga), indium (In), manganese (Mn) or tin (Sn). By adding the companion materials, such as companion metals, a melting temperature between 700-900° C. can be set with advantage. The companion metals Ga, In, Mn or Sn prove to be particularly advantageous because they are also suitable for a soldering methods at low vapour pressures, for example below $10^{-3}$ mbar, for example in vacuum soldering.

In a further embodiment of the present invention, it is intended that the companion material has a proportion of 5 to 50 wt. % of the soldering material, preferably 5 and 40 wt. %, and especially 5 and 35 wt. %. The proportion of companion material to be added preferably depends on a desired melting temperature which is intended for the soldering process. It applies in particular to In, Ga and Sn: The more companion materials the lower the melting or soldering temperature. However, the lowering of the melting temperature is limited to the extent that the melting or soldering temperature must be so high that a chemical reaction takes place between the active metal and the ceramic surface. Typically the melting temperature has to be above 700 and 800° C. With a composition in which the proportion of the companion material is between 5 and 35 wt. %, it is advantageous possible to provide an active metal in which, on the one hand, the melting temperature reduction is sufficiently high and, on the other hand, which is compatible with as many different ceramic surfaces as possible. In addition, a proportion of intermetallic phases that can lead to a reduced mechanical strength of the soldered joint can be reduced, since the proportion of intermetallic phases increases with the proportion of companion materials.

It is useful for the soldering material to have Ti, Zr, Hf, Cr, V, Y, Sc or Ce as the active metal. In particular, it is provided that the active metal has a proportion of 0.5 to 10 wt. %, preferably of 1 to 5 wt. % and particularly preferably of 1 to 3 wt. % of the soldering material. The proportion of active metal is preferably adjusted depending on the application, for example depending on the materials to be joined.

In particular, it is provided that the soldering material is a paste or foil. For example, the paste is preferably provided as a composition of a powder, which in addition to copper and the active metal also includes the companion material, and organic substances. The organic substances make the paste screen-printable and curable. In an advantageous design it is intended that the copper and the companion materials are present as micro-alloyed powder. For example, it is a micro-alloyed powder which is produced within an atomisation process by means of an atomisation plant. The active metal is preferably added in powder form, for example as Ti, Zr, TiH and/or ZrH. In order to increase the solubility of the active metal in the soldering process, it is advantageous that the active metal is also added or mixed to the soldering material in powder form together with the other materials of the soldering material as a binary or ternary alloy. For a homogeneous distribution of the active metal, it is conceivable that the active metal is integrated into the powder to be alloyed in the atomization plant. Since the active metal reacts with a wall of the atomization plant, a proportion of the active metal of 1 to 2 vol % is preferred here.

If the soldering material is provided as foil, organic additives can be advantageously avoided. To form the solder layer, the foil is placed between the metallization and the carrier layer. A comparatively low proportion of companion materials and active metals in the soldering material is particularly preferred.

In accordance with a preferred form of the present invention, it is provided that the soldering material should essentially be

- 64 wt. % copper, 34 wt. % manganese and 2 wt. % titanium,
- 64 wt. % copper, 34 wt. % indium and 2 wt. % titanium,
- 75 wt. % copper, 23 wt. % tin and 2 wt. % titanium,
- 69 wt % copper, 13 wt % tin, 16 wt % indium and 2 wt % titanium,
- 66 wt % copper, 16 wt % tin, 16 wt % manganese and 2 wt % titanium,
- 66 wt. % copper, 16 wt. % indium, 16 wt. % manganese and 2 wt. % titanium or
- 69 wt. % copper, 12 wt. % tin, 7 wt. % manganese, 10 wt. % indium and 2 wt. % titanium, and unavoidable impurities of less than 0.5 wt. %. In particular, the term "essentially" refers to such deviations that deviate from the respective exact value by +/−10%, preferably by +/−5% and/or correspond to deviations in form of changes that are insignificant for the function.

Another subject matter of the present invention is a carrier layer having a metallization, the metallization being bonded to the carrier layer via the soldering material according to one of the previous claims. All features discussed for the soldering material of the present invention and their advantages can be transferred analogously to the carrier layer of the present invention and vice versa. Preferably, the metallization, for example a copper or molybdenum layer, is structured for the formation of conductor tracks and connection points for electrical or electronic components. The structuring is preferably realized by etching.

Another subject matter of the invention is a method for bonding a metallization to a carrier layer, in particular a carrier layer comprising ceramics, using a solder according to one of the previous claims. All features discussed for the soldering material of the present invention and their advantages can also be transferred to the method of the present invention and vice versa.

It is preferable that bonding should be performed at a soldering temperature of less than 1000°, preferably less than 900° C. and particularly preferably less than 850° C.

Preferably the soldering material is designed accordingly, for example by adding an appropriate amount of active metals or companion metals to achieve the desired temperature. By soldering at low temperatures, especially below 850° C., it is possible to keep the energy consumption during soldering comparatively low.

According to a further embodiment of the present invention, it is provided that the soldering material is applied to the ceramic carrier layer in a screen printing process. This allows the soldering material to be applied evenly over a large area in an advantageous way, especially for the flat bonding of a metal layer to a ceramic layer.

FIG. 1 shows a carrier layer 2 with a metallization according to an exemplary embodiment of the present invention. This is preferably a carrier layer 2, on which electronic or electrical components are arranged. A metallization 3, preferably a structured metallization 3, is provided for this purpose in order to provide conductor tracks or connection points for the electrical or electronic components. The metallization 3 is preferably bonded to the carrier layer 2, which in particular comprises copper, by means of an active soldering process. In order to reduce manufacturing costs and avoid silver migration, it is preferred that active soldering be carried out with soldering material 1, which comprises copper and is essentially silver-free.

In the active soldering process, a bond is formed between a metal foil, e.g. a copper foil, and a ceramic substrate, e.g. an aluminium nitride ceramic, at a temperature between approx. 650-1000° C. using soldering material 1, which also comprises an active metal in addition to a main component of copper. This active metal, which for example is at least one element of the group Hf, Ti, Zr, Nb, Ce, forms a bond between the soldering material and the ceramic by chemical reaction, while the bond between the soldering material and the metal is a metallic brazing bond.

In order to adapt the soldering material to the required melting temperatures, it is particularly intended that the soldering material 1 has a companion material, preferably Ga, In, Mn or Sn.

The invention claimed is:

1. A soldering material (1) for active soldering of a metallization (3) to a carrier layer (2) comprising ceramics, wherein the soldering material comprises copper and is essentially silver-free, the soldering material (1) being
   64 wt. % copper, 34 wt. % manganese and 2 wt. % titanium,
   69 wt. % copper, 13 wt. % tin, 16 wt. % indium and 2 wt. % titanium,
   66 wt. % copper, 16 wt. % tin, 16 wt. % manganese and 2 wt. % titanium,
   66 wt. % copper, 16 wt. % indium, 16 wt. % manganese and 2 wt. % titanium or
   69 wt. % copper, 12 wt. % tin, 7 wt. % manganese, 10 wt. % indium and 2 wt. % titanium.

2. The soldering material (1) according to claim 1, wherein the soldering material (1) is a paste or foil.

3. A carrier layer (2) having a metallization (3), wherein the metallization (3) is bonded to the carrier layer (2) via the soldering material (1) according to claim 1.

4. A method for bonding a metallization (3) to a carrier layer (2), comprising a soldering material (1) being essentially
   64 wt. % copper, 34 wt. % manganese and 2 wt. % titanium,
   64 wt. % copper, 34 wt. % indium and 2 wt. % titanium,
   75 wt. % copper, 23 wt. % tin and 2 wt. % titanium,
   69 wt. % copper, 13 wt. % tin, 16 wt. % indium and 2 wt. % titanium,
   66 wt. % copper, 16 wt. % tin, 16 wt. % manganese and 2 wt. % titanium,
   66 wt. % copper, 16 wt. % indium, 16 wt. % manganese and 2 wt. % titanium or
   69 wt. % copper, 12 wt. % tin, 7 wt. % manganese, 10 wt. % indium and 2 wt. % titanium, wherein bonding is realized at a soldering temperature of less than 850° C.

5. The method according to claim 4, wherein the soldering material (1) is applied in a screen printing process to the carrier layer (2) comprising the ceramic.

* * * * *